(12) United States Patent
Feller et al.

(10) Patent No.: US 9,006,672 B2
(45) Date of Patent: Apr. 14, 2015

(54) NEUTRON DETECTION

(71) Applicant: Nova Scientific, Inc., Sturbridge, MA (US)

(72) Inventors: W. Bruce Feller, Tolland, CT (US); Paul L. White, Sturbridge, MA (US)

(73) Assignee: Nova Scientific, Inc., Sturbridge, MA (US)

( * ) Notice: Subject to any disclaimer, the term of this patent is extended or adjusted under 35 U.S.C. 154(b) by 0 days.

(21) Appl. No.: 14/449,808

(22) Filed: Aug. 1, 2014

(65) Prior Publication Data

US 2014/0339433 A1 Nov. 20, 2014

Related U.S. Application Data

(63) Continuation of application No. 13/964,891, filed on Aug. 12, 2013, now Pat. No. 8,835,864, which is a continuation of application No. 13/069,898, filed on Mar. 23, 2011, now Pat. No. 8,507,872.

(60) Provisional application No. 61/316,710, filed on Mar. 23, 2010, provisional application No. 61/354,607, filed on Jun. 14, 2010.

(51) Int. Cl.
| | |
|---|---|
| G01T 3/08 | (2006.01) |
| H01J 47/12 | (2006.01) |
| G01T 3/00 | (2006.01) |
| G01T 3/06 | (2006.01) |
| H01L 31/0216 | (2014.01) |
| H01L 31/0352 | (2006.01) |
| H01L 31/08 | (2006.01) |
| G01V 5/00 | (2006.01) |
| H01L 31/18 | (2006.01) |

(52) U.S. Cl.
CPC .............. *H01J 47/1205* (2013.01); *G01T 3/00* (2013.01); *G01T 3/08* (2013.01); *G01T 3/06* (2013.01); *H01L 31/0216* (2013.01); *H01L 31/0352* (2013.01); *H01L 31/085* (2013.01); *G01T 3/085* (2013.01); *G01V 5/0091* (2013.01); *H01L 31/18* (2013.01)

(58) Field of Classification Search
USPC .................. 250/391, 390.01, 370.05; 438/56
See application file for complete search history.

(56) References Cited

U.S. PATENT DOCUMENTS

| | | | |
|---|---|---|---|
| 6,876,711 | B2 | 4/2005 | Wallace et al. |
| 7,183,701 | B2 | 2/2007 | Downing et al. |
| 7,265,359 | B2 | 9/2007 | Ambrosi et al. |
| 7,333,701 | B1 | 2/2008 | Feller et al. |
| 7,439,519 | B2 | 10/2008 | Feller et al. |

(Continued)

OTHER PUBLICATIONS

E.H. Eberhardt, ITT Electro-Optical Products Division, Technical Note 127: Parameters Pertaining to Microchannel Plates and Microchannel Plate Devices, pp. 1-17, (Aug. 1980).

(Continued)

*Primary Examiner* — David Porta
*Assistant Examiner* — Abra Fein
(74) *Attorney, Agent, or Firm* — Fish & Richardson P.C.

(57) ABSTRACT

A neutron detector includes a microchannel plate having a structure that defines a plurality of microchannels, and layers of materials disposed on walls of the microchannels. The layers include a layer of neutron sensitive material, a layer of semiconducting material, and a layer of electron emissive material. For example, the layer of neutron sensitive material can include boron-10, lithium-6, or gadolinium.

20 Claims, 9 Drawing Sheets

(56) References Cited

U.S. PATENT DOCUMENTS

| | | |
|---|---|---|
| 7,514,694 B2 | 4/2009 | Stephan et al. |
| 7,745,800 B1 | 6/2010 | McGinnis |
| 8,507,872 B2 | 8/2013 | Feller et al. |
| 2005/0258372 A1 | 11/2005 | McGregor et al. |
| 2009/0091258 A1 | 4/2009 | Heuser et al. |
| 2009/0101831 A1 | 4/2009 | Zhong et al. |
| 2009/0212680 A1 | 8/2009 | Tremsin et al. |
| 2010/0001193 A1 | 1/2010 | Feller et al. |
| 2010/0019164 A1 | 1/2010 | Stephan et al. |
| 2010/0044577 A1 | 2/2010 | Sullivan et al. |

OTHER PUBLICATIONS

Application as filed for U.S. Appl. No. 13/016,876, filed Jan. 28, 2011, 42 pages.

NEUTRON DETECTION

CROSS REFERENCE TO RELATED APPLICATIONS

This application is a continuation of and claims priority to U.S. patent application Ser. No. 13/964,891, filed on Aug. 12, 2013, which is a continuation of and claims priority to U.S. patent application Ser. No. 13/069,898, filed on Mar. 23, 2011, issued as U.S. Pat. No. 8,507,872 on Aug. 13, 2013, which claims priority to U.S. Provisional Patent Application 61/316,710, filed on Mar. 23, 2010 and U.S. Provisional Patent Application 61/354,607, filed on Jun. 14, 2010. Each of these applications is incorporated by reference in its entirety.

BACKGROUND

This invention relates to neutron detection.

Neutron-sensitive microchannel plates (MCPs) can be used to detect special nuclear materials (SNM), such as plutonium, or can be used in neutron imaging. A microchannel plate can be formed by bonding a glass plate between an input electrode and an output electrode, and providing a high voltage direct current (DC) field between the electrodes. The glass plate is perforated with a substantially regular, parallel array of microscopic channels, for example, cylindrical and hollow channels. Each channel, which can serve as an independent electron multiplier, has an inner wall surface formed of a semi-conductive and electron emissive layer.

The glass plate can be doped with, for example, boron-10, which can capture neutrons in reactions that generate lithium-7 and alpha particles. As the lithium-7 and alpha particles enter nearby channels and collide against the wall surfaces to produce secondary electrons, a cascade of electrons can be formed as the secondary electrons accelerate along the channels (due to the DC field), and collide against the wall surfaces farther along the channels, thereby increasing the number of secondary electrons. The electron cascades develop along the channels and are amplified into detectable signals that are electronically registered and processed to construct a digital image. The resultant intensity map or image corresponds to the variation in neutron flux striking the microchannel plate's surface. Contrast differences within the image of a sample can be used to infer physical and chemical properties.

SUMMARY

In general, in one aspect, an apparatus comprises a microchannel plate comprising a structure that defines a plurality of microchannels; and layers of materials disposed on walls of the microchannels, the layers including a layer of neutron sensitive material, a layer of semiconducting material, and a layer of electron emissive material.

Implementations of the apparatus may include one or more of the following features. The layer of neutron sensitive material can include at least 50 mol % of neutron sensitive material. The layer of neutron sensitive material can include at least one of boron-10, lithium-6, or gadolinium. The layer of neutron sensitive material can include a compound having at least one of boron-10 or gadolinium. The compound can include at least one of boron-10 oxide, boron-10 nitride, lithium-6 oxide, or gadolinium oxide. The layer of neutron sensitive material can have a thickness in a range from 0.5 to 5 microns. The layer of semiconducting material can have a thickness in a range from 50 to 1000 nm. The layer of electron emissive material can have a thickness in a range from 3 to 12 nm. The structure can include glass. The glass can have less than 25 mol % lead (Pb). In some examples, the glass can have less than 1 mol % lead (Pb). In some examples, the glass can have more than 1 mol % lead (Pb). The glass can have less than 25 mol % of elements having an atomic number greater than 34. In some examples, the glass can have less than 1 mol % of elements having an atomic number greater than 34. In some examples, the glass can have more than 1 mol % of elements having an atomic number greater than 34. The glass can have less than 20 mol % of neutron sensitive material. In some examples, the glass can have more than 1 mol % of neutron sensitive material. In some examples, the glass can have less than 1 mol % of neutron sensitive material. The layer of neutron sensitive material can be without glass. The semiconducting material can include $AlZn_xO_y$ alloy (x and y being positive integers). The electron emissive material can include at least one of aluminum oxide ($Al_2O_3$) or magnesium oxide (MgO). Each of at least some of the microchannels can have a diameter in a range between 5 to 10 microns. Each of at least some of the microchannels can have a diameter less than 150 microns. Each of at least some of the microchannels can have a length that is at least 10 times the diameter of the microchannel. Each of at least some of the microchannels can have a circular, a square, a rectangular, or a hexagonal cross section. The apparatus can include an image sensor to detect the secondary electron emissions. The apparatus can include a gamma ray detector to detect gamma rays, and a coincidence unit to determine whether a first signal output from the gamma ray detector indicating detection of a gamma ray occurs within a predetermined time period after a second signal output from the microchannel plate indicating detection of at least one of a neutron or a gamma ray. The neutron sensitive material can include at least one of boron-10 or gadolinium. The microchannel plate can include an input electrode, an output electrode, and a glass plate comprising the microchannels, and the apparatus can further include a data processor to determine whether a neutron has been detected based on first information derived from a first charge induced on the input electrode and second information derived from a second charge induced on the output electrode. The data processor can be configured to calculate a ratio between the first charge and the second charge, calculate a sum of the first and second charges, and determine whether a neutron has been detected based on the ratio and the sum. The data processor can be configured to calculate a parameter value based on dividing the ratio by the sum, compare the parameter value with a predetermined range of values, and determine that a neutron has been detected when the parameter value is within the predetermined range of values. The neutron sensitive material can include at least one of boron-10 or lithium-6.

In general, in another aspect, a method of fabricating a microchannel plate includes fabricating a structure that defines a plurality of microchannels; and depositing a layer of neutron sensitive material, a layer of semiconducting material, and a layer of electron emissive material on walls of the microchannels.

Implementations of the method may include one or more of the following features. Atomic layer deposition can be used to deposit a layer of neutron sensitive material. The layer of neutron sensitive material can include at least one of boron-10 or gadolinium. The layer of neutron sensitive material can include a compound material having at least one of boron-10, gadolinium, or lithium-6. The layer of neutron sensitive material can include at least one of boron-10 oxide, boron-10 nitride, lithium-6 oxide, or gadolinium oxide. The layer of neutron sensitive material can have a thickness in a range from 0.5 to 5 microns. The layer of neutron sensitive material can include at least two of boron-10, lithium-6, or gadolinium. Atomic layer deposition can be used to deposit the layer of semiconducting material. The layer of semiconducting material can have a thickness in a range from 50 to 1000 nm. Atomic layer deposition can be used to deposit the layer of electron emissive material. The layer of electron emissive material can have a thickness in a range from 3 to 12 nm. The structure that defines a plurality of microchannels can be fabricated using a plurality of fibers each including a soluble core and a layer of cladding surrounding the soluble core, and removing the soluble core to form microchannels. The structure can be fabricated using glass. The structure can be fabricated using glass that has less than 25 mol % lead (Pb). In some examples, the structure can be fabricated using glass that has less than 1 mol % lead (Pb). In some examples, the structure can be fabricated using glass that has more than 1 mol % lead (Pb). The structure can be fabricated using glass that has less than 25 mol % of elements having an atomic number greater than 34. In some examples, the structure can be fabricated using glass that has less than 1 mol % of elements having an atomic number greater than 34. In some examples, the structure can be fabricated using glass that has more than 1 mol % of elements having an atomic number greater than 34. The method can include forming an input electrode on an input surface of the microchannel plate and an output electrode on an output surface of the microchannel plate. The layer of neutron sensitive material can be deposited on the walls of the microchannels first, followed by depositing the layer of semiconducting material, and followed by depositing the layer of electron emissive material.

In general, in another aspect, a method of detecting neutrons includes using a layer of neutron sensitive material formed on a wall of a microchannel of a microchannel plate to capture a neutron and generate at least one reactant particle, the microchannel plate including a glass plate having a structure that defines the microchannel, the glass plate including glass having less than 25 mol % lead (Pb) and less than 20 mol % of the neutron sensitive material; detecting secondary electrons that are generated based on an interaction between the reactant particle and a layer of electron emissive material on the wall of the microchannel; and generating a first signal indicating detection of a neutron.

Implementations of the method may include one or more of the following features. The method can include generating a second signal indicating detection of the secondary electrons, generating a third signal indicating detection of a gamma ray, determining whether the third signal occurred within a specified time period after occurrence of the second signal, and generating the first signal only if the third signal occurred within the specified time period after occurrence of the second signal. The glass plate can include glass having less than 1 mol % lead (Pb). The glass plate can include glass having less than 0.1 mol % of the neutron sensitive material.

In general, in another aspect, an apparatus includes a microsphere plate having a plurality of microspheres that define interstices between the microspheres; and layers of materials disposed on surfaces of the microspheres, the layers including a layer of neutron sensitive material, a layer of semiconducting material, and a layer of electron emissive material.

In general, in another aspect, an apparatus includes a microfiber plate having a plurality of microfibers that define interstices between the microfibers; and layers of materials disposed on surfaces of the microfibers, the layers including a layer of neutron sensitive material, a layer of semiconducting material, and a layer of electron emissive material.

DETAILED DESCRIPTION

Figure 1A:
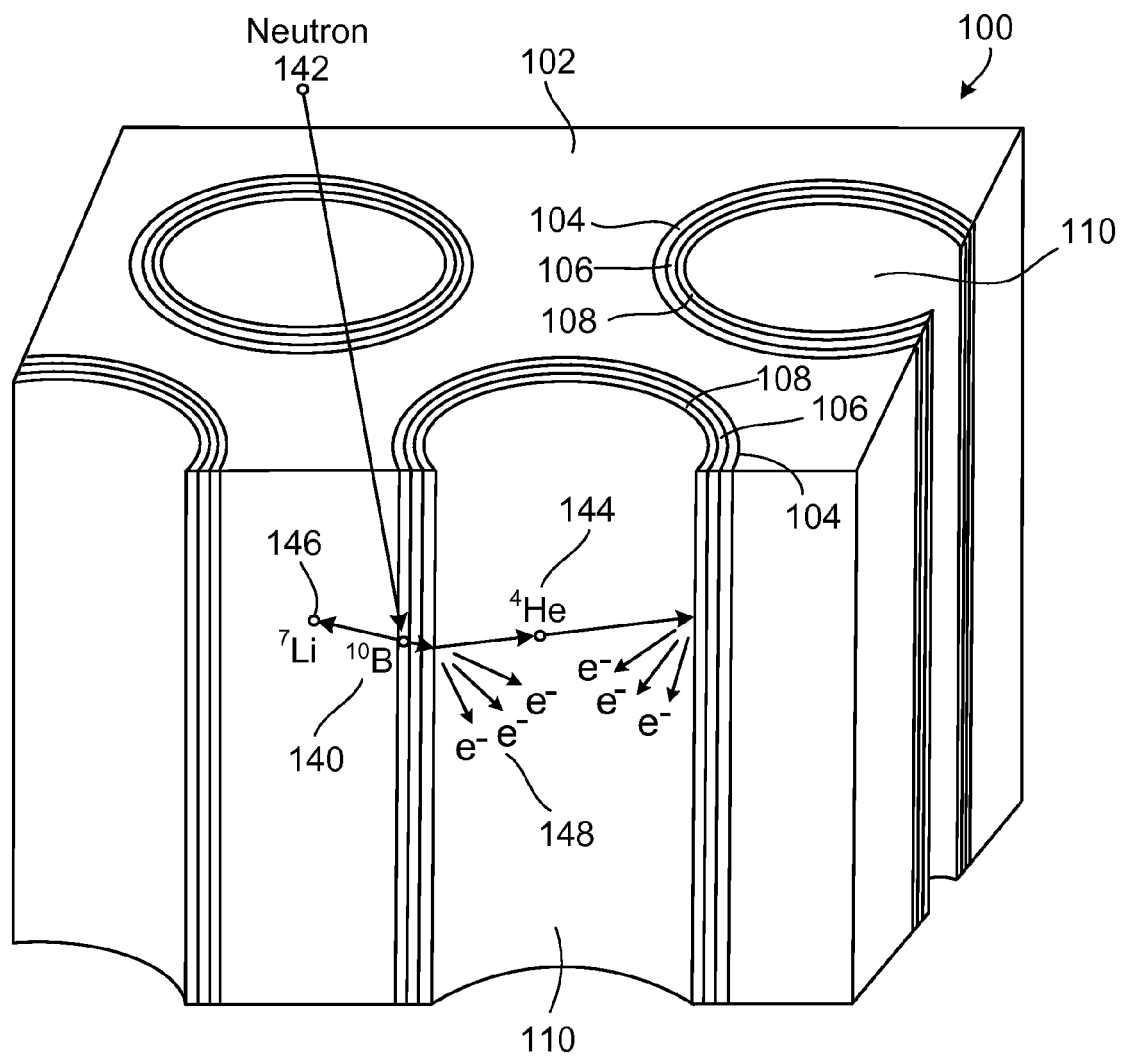
FIG. 1A shows a cut-out view of an example microchannel plate.
Figure 1B:
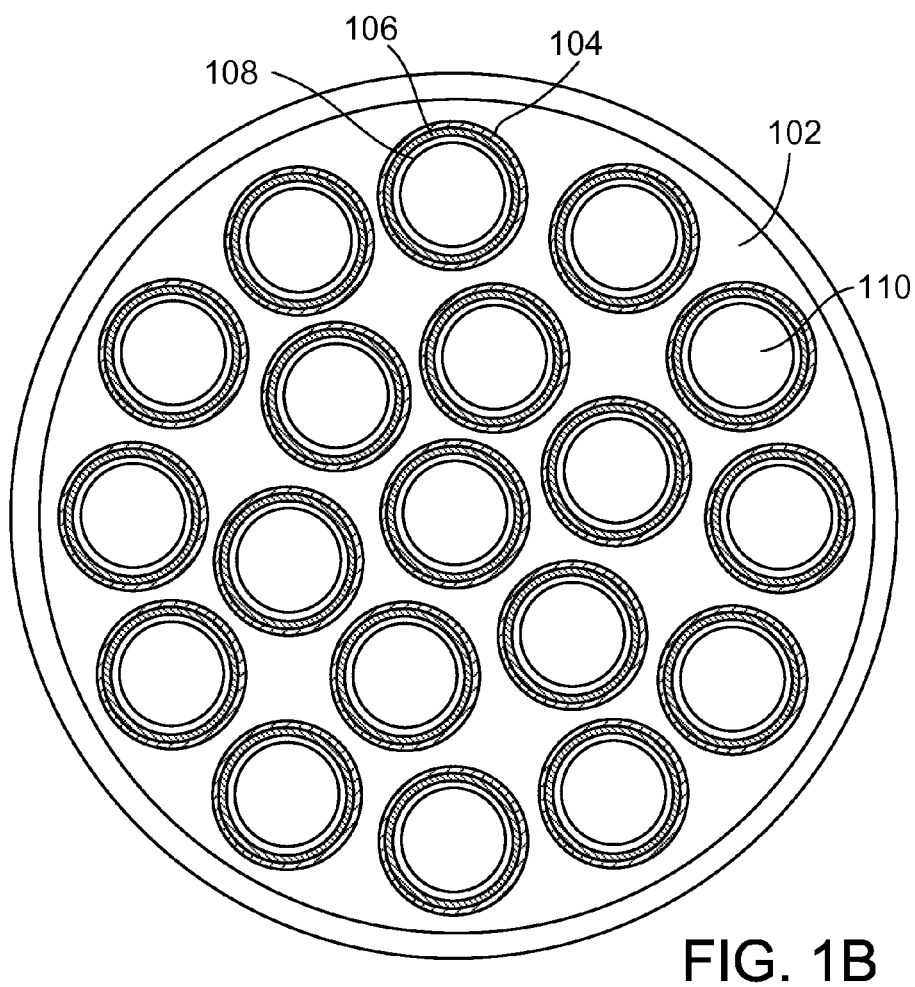
FIG. 1B shows a cross-sectional view of the microchannel plate of FIG. 1A along a plane perpendicular to the lengthwise direction of microchannels.
Figure 1C:
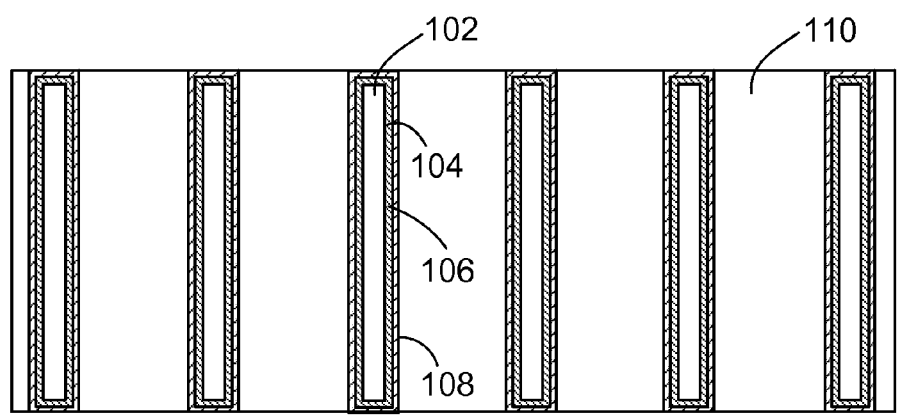
FIG. 1C shows a cross-sectional view of the microchannel plate of FIG. 1A along a plane parallel to the lengthwise direction of microchannels.

Referring to FIGS. 1A, 1B, and 1C, a neutron detector having a high sensitivity to neutrons and low sensitivity to gamma rays can be fabricated by using a microchannel plate 100 having a glass plate 102 made of low-Z glass without lead or other high mass components (materials having atomic numbers larger than 34). The glass plate 102 has a substantially regular, parallel array of microscopic channels 110 each having a diameter of about, for example, 5 to 10 microns ($\mu$m). Each channel can have, for example, a circular, square, rectangle, or hexagon cross sectional shape. FIG. 1A shows a cut-out view of the microchannel plate 100; FIG. 1B shows a cross-sectional view of the microchannel plate 100 along a plane perpendicular to the lengthwise direction of the microchannels 110; and FIG. 1C shows a cross-sectional view of the microchannel plate 100 along a plane parallel to the lengthwise direction of the microchannels 110. A thin layer of neutron-absorbing material 104, a thin layer of semiconducting material 106, and a thin layer of electron emissive material 108 are formed on the surfaces of the microchannels 110 using, for example, atomic layer deposition.

Figure 4:
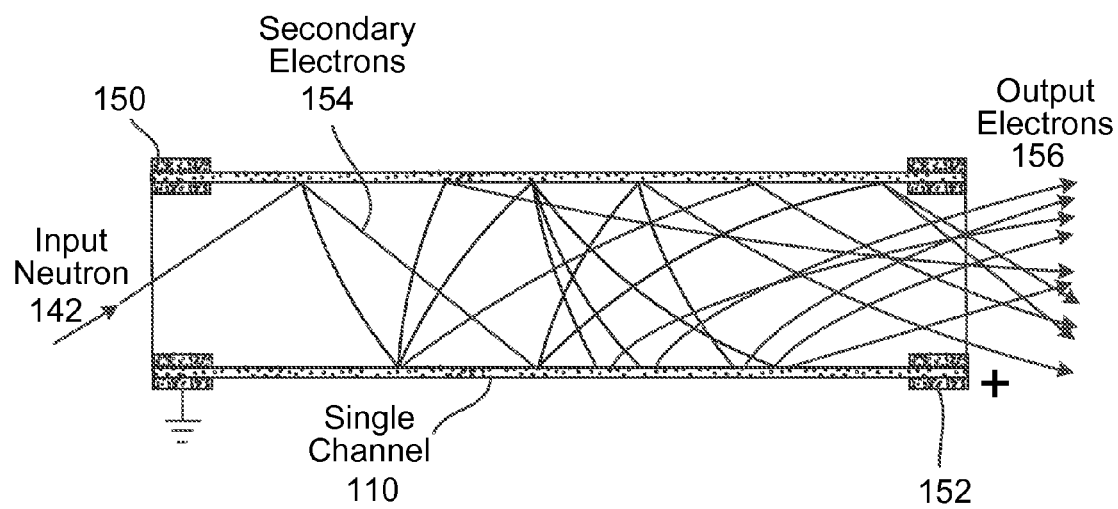
FIG. 4 is a diagram showing the development of an avalanche of secondary electrons.
Figure 5:
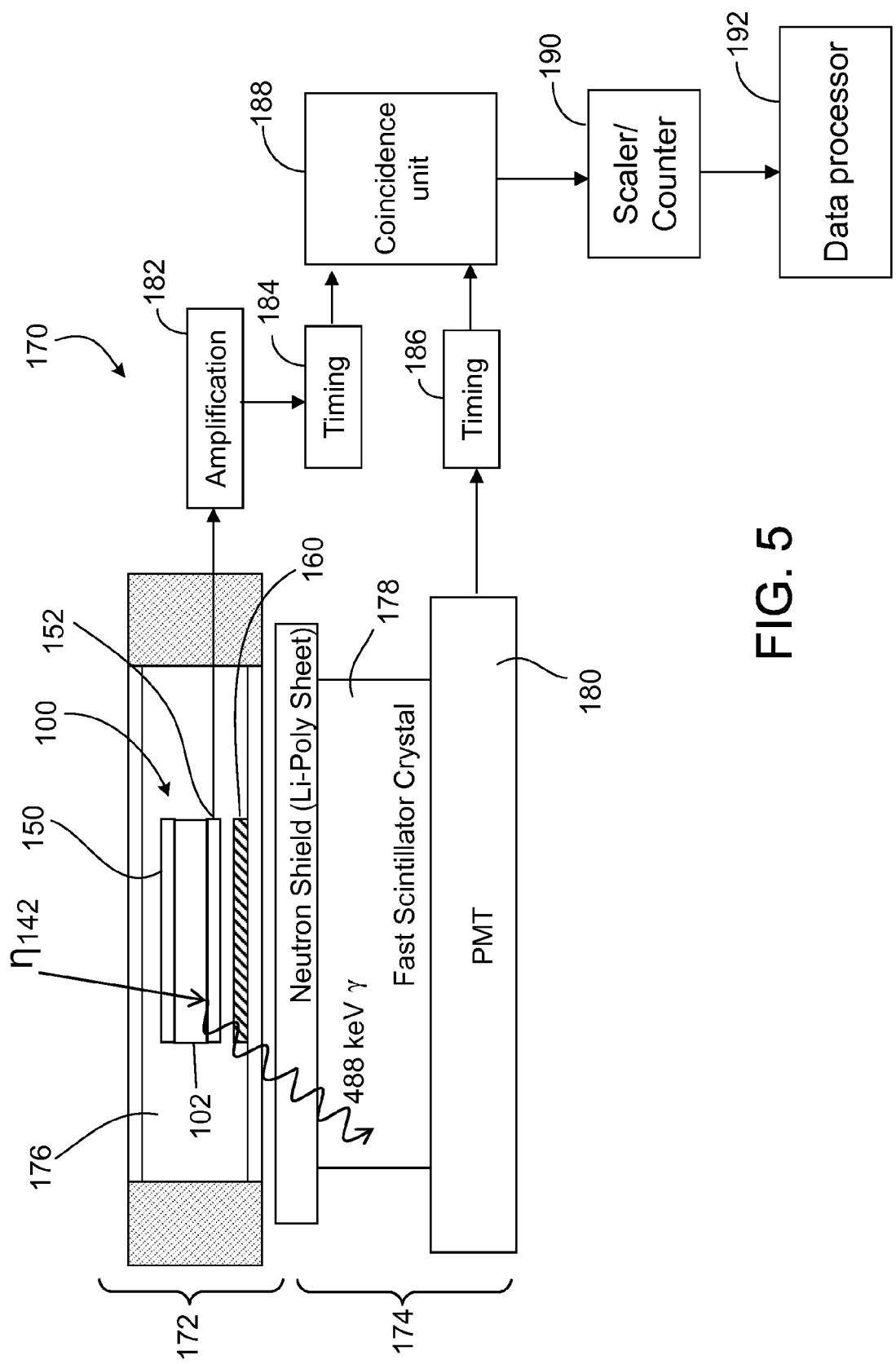
FIGS. 5 and 6 are block diagrams of neutron detectors.

The glass plate 102 is positioned between an input electrode 150 and an output electrode 152 (see FIGS. 4 and 5). The input and output electrodes 150, 152 can be metal layers (for example, nichrome) that are coated onto the input and output surfaces of the glass plate 102. The input and output electrodes 150, 152 have openings that correspond to the channel openings. The input and output electrodes 150, 152 are biased at DC voltage levels configured to generate a high electric field in the microchannels 110. When an incident neutron interacts with neutron-absorbing material 104, the interaction produces moving charged particles that interact with the electron emissive material 108, which in turn emits electrons that are attracted toward the end of the microchannel 110 having a higher electric potential. As the electrons strike against the channel walls, more electrons are released from the electron emissive layer 108. From a single neutron, thousands of electrons emerge from the microchannel plate 100. The electrons can be electronically captured as a signal pulse or allowed to strike a phosphor screen for visual imaging.

By using a glass plate 102 without lead or other high mass components, there will be a lower probability of false detection of neutrons due to reactions between ambient gamma rays and lead or other high mass components, as may occur in a conventional microchannel plate that uses glass with lead or other high mass components. Reducing the sensitivity of the microchannel plate 100 to gamma rays can increase the signal-to-noise (S/N) ratio of neutron detection, leading to higher contrast radiography and detection of smaller features using neutron imaging. The insensitivity of the microchannel plate 100 to gamma rays also allows lower level detection of clandestine nuclear materials, such as plutonium. For example, by using low-Z glass, the gamma sensitivity can be reduced by a factor of about 10 (compared to use of leaded glass), to approximately 0.1%.

The glass plate 102 can also use glass with lead or other high mass components, such as commercially available glass designed for microchannel plates, available from Photonis, Sturbridge, Mass. When such glass material is used, there is a probability of false detection of neutrons due to reactions between ambient gamma rays and the lead or other high mass components. False detection can be reduced by using a coincidence technique or an induced pulse technique, described in more detail below. In some examples, the glass may have more than 1 mol % and less than 25 mol % of lead or other element having an atomic number greater than 34.

To fabricate the microchannel plate 100, a glass plate 102 having a substantially regular, parallel array of microscopic channels 110 is fabricated. Atomic layer deposition thin film techniques are used to modify the surfaces of the microscopic channels 110 by forming a sequence of functional layers that conformally coat the surfaces of the glass plate 102, including the surfaces of the microchannels 110.

In some implementations, a neutron-absorbing layer 104 of boron-10 compound, such as boron-10 oxide ($^{10}B_2O_3$), boron-10 nitride ($^{10}BN$), or other material, having a thickness of about 1 μm, is formed on the surface of the microchannels 110 by atomic layer deposition and serves as heavy charged particle and prompt gamma ray-emitting medium. The boron-10 enriched layer can have a thickness within a range of, for example, approximately 0.5 μm to 5 μm.

When a boron-10 atom 140 captures a neutron 142, the boron-10 nucleus fissions into an alpha particle ($^4He$) 144 and a lithium-7 ($^7Li$) particle 146 traveling in opposite directions, as in the reaction below:

$$n + {}^{10}B \rightarrow {}^7Li + {}^4He + Q,$$

where Q is the energy released in the reaction. There is about 94% probability that the lithium-7 ion will initially be in an excited state, upon which the lithium-7 ion decays to a lower energy state and emits a 478 keV gamma ray. In some implementations, as described below, a coincidence technique or an induced pulse technique can be used to differentiate the prompt emission of the gamma ray from background gamma rays to increase the accuracy of the neutron detection.

A resistive (semiconducting) coating 106 is deposited by atomic layer deposition on top of the neutron-absorbing layer 104 to establish an electric field gradient and simultaneously allow a small leakage or bias current to flow through the microchannel surface, neutralizing the positive surface charge due to emission of secondary electrons that form the detectable electron amplification pulse following an electron avalanche. In some examples, the semiconducting layer can have a thickness of about 100 nm. For example, the layer 106 can include a $AlZn_xO_y$ alloy film. Other materials can also be used. The semiconducting layer 106 can have a thickness in a range from, for example, 50 to 1000 nm.

A thin layer 108 of material having a high secondary electron yield coefficient (SEC) is deposited by atomic layer deposition on top of the semiconducting coating 106 to enhance the overall gain. For example, the layer 108 can include aluminum oxide ($Al_2O_3$) or magnesium oxide (MgO). Other materials can also be used. The electron emissive layer 108 can have a thickness in a range from, for example, 3 to 12 nm, or preferably 5 to 10 nm.

In some implementations, the atomic layer deposition can be a thin film growth technique that uses alternating, saturating reactions between gaseous precursor molecules and a substrate to deposit films in layer-by-layer fashion. By repeating this reaction sequence in an ABAB . . . pattern, films from atomic monolayers to layers that are several microns thick can be deposited with high and controlled precision.

In some implementations, the boron-10 oxide (or other compound containing boron-10) can be replaced by gadolinium oxide ($Gd_2O_3$) of about the same thickness. Gadolinium can capture neutrons as in the following reactions:

$$n + {}^{155}Gd \rightarrow {}^{156}Gd + \text{gamma rays} + \text{beta particles} + x\text{-rays}$$
(29 keV to 182 keV), $$n + {}^{157}Gd \rightarrow {}^{158}Gd + \text{gamma rays} + \text{beta particles} + x\text{-rays}$$
(39 keV to 199 keV).

The beta particles (energetic electrons) can cause secondary electron emissions in the microchannels 110. In some implementations, the coincidence technique or the induced pulse technique can be used to differentiate the gamma rays (generated from the neutron-gadolinium interaction) from background gamma rays to increase the accuracy of the neutron detection.

In some implementations, the layer 104 includes alternating monolayers of boron-10 and gadolinium.

In some implementations, the layer 104 can include, for example, $Li_2O$, $LiCO_3$, or other compounds containing lithium-6. Lithium-6 can capture neutrons as in the following reaction:

$$6Li \rightarrow 4He + 3H + 4.78 \text{ MeV}.$$

When a boron-10 particle 140 captures a neutron 142 and generates a lithium-7 particle 146 and a helium-4 particle 144, one or both of the lithium-7 and helium-4 particles pass out of the glass substrate and enter one or more adjacent channels 110, in most cases freeing several (for example, 10 to 100) electrons 148 along the way. For example, other charged particles, such as protons, hydroxide ions (OH⁻), cesium ions (the glass plate 102 may include cesium oxide) may also be freed by the lithium-7 and helium-4 particles, emerge from the glass walls and enter into the channels 110.

In some implementations, the input electrode 150 may be connected to a voltage source to have a voltage level of −2000 to −1000 volts, and the output electrode 152 may be connected to a voltage source to have a voltage level of −100 volts. The DC voltage difference between the input and output electrodes 150, 152 generates an electric field (e.g., about 1 kV/mm) that attracts the free electrons toward the output electrode 152. As the electrons strike against the channel walls, more electrons are released, triggering an avalanche of secondary electrons in the microchannels 110 that can be detected using a signal read out from the output electrode 152.

In some examples, the neutron-absorbing layer 104 has a high concentration of gadolinium or boron-10 atoms, such that the overall amount of gadolinium or boron-10 atoms in the neutron-absorbing layer 104 can be comparable to (or higher than) a conventional microchannel plate in which the gadolinium or boron-10 atoms are doped within the body of the glass plate. Thus, an incident neutron would just as likely to strike a gadolinium or boron-10 atom in the neutron-absorbing layer 104, compared to striking a gadolinium or boron-10 atom in the glass plate of the conventional microchannel plate.

In the case where the neutron-absorbing layer 104 contains lithium-6 atoms, the overall amount of lithium-6 atoms in the neutron-absorbing layer 104 can be higher than the amount of lithium-6 atoms that can practically be doped within the body of the glass plate. This is because elevated levels of lithium in glass (e.g., more than a few mole percent) may result in undesirable devirification or crystallization of the glass upon cooling from the melt. This problem does not occur (or is not significant) when lithium-6 is contained in a thin layer 104 on the wall of the microchannels 110.

By using thin layers of boron-10, gadolinium, or lithium-6 on the surfaces of the microchannels 110, the sensitivity of neutron detection can be improved, compared to the conventional microchannel plate that has boron-10, gadolinium, or lithium-6 distributed throughout the bulk or body of the glass plate. The improvement in sensitivity can be due to an increased concentration of boron-10 or gadolinium atoms, as well as reduced self-absorption of the alpha particle or lithium nucleus (in the case of boron-10), conversion electron (in the case of gadolinium) or alpha particle and triton (in the case of lithium-6). When a neutron is captured by a boron-10, lithium-6, or gadolinium atom inside the glass substrate, the resulting helium-4, lithium-7 particle, triton, or conversion electron needs to enter the microchannel 110 in order to generate a cascade of secondary electrons that can be detected at the output electrode 152.

In the conventional microchannel plate, the interaction between the neutron and boron-10 or lithium-6 (or gadolinium) atom may occur anywhere inside the glass substrate, for example, a location near the middle between two adjacent microchannels. By comparison, in the microchannel plate 100 of FIG. 1, the interaction between the neutron and boron-10 atom occurs in the neutron-absorbing layer 104. The likelihood of at least one of the resultant particles (helium-4 or lithium-7) escaping from the neutron-absorbing layer 104 and entering an adjacent microchannel 110 in the microchannel plate 100 can be higher than that of the conventional microchannel plate.

In some implementations, the bulk of the glass plate 102 can use glass doped with neutron sensitive material, such as boron-10, lithium-6 and/or gadolinium. For example, the glass can have 0 to 20 mol % of neutron sensitive material. A layer of neutron sensitive material 104 is additionally provided on the microchannel surface. Although the $^{10}B$, $^{6}Li$ and/or Gd atoms in the bulk glass may not be as effective in neutron conversion as those in the layer 104 (due to the longer escape paths required for the charged particle reactants to reach the microchannel surfaces), the $^{10}B$, $^{6}Li$ and/or Gd atoms in the bulk glass will not diminish the neutron conversion capability of the layer 104, and may even slightly enhance the overall neutron detection sensitivity of the microchannel plate.

Figure 2:
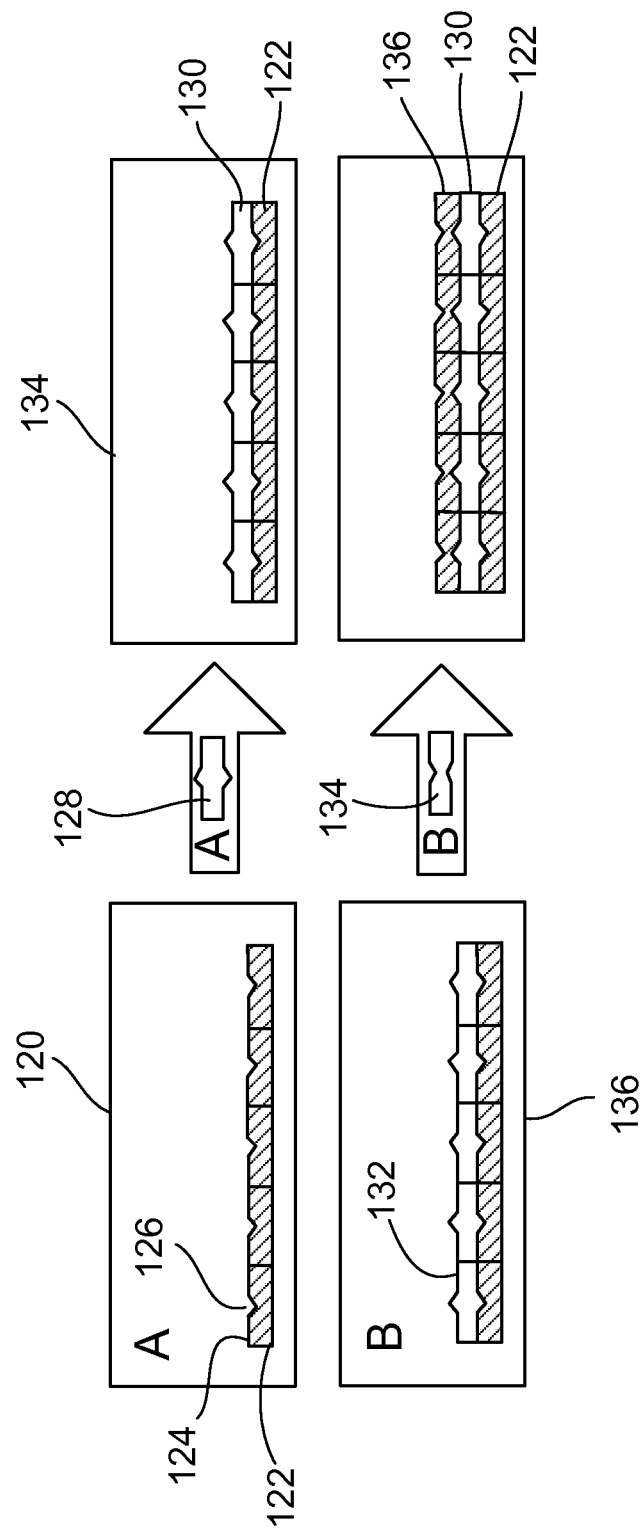
FIG. 2 shows an AB sequence for atomic layer deposition of a monolayer of a compound AB.

FIG. 2 shows an AB sequence for the atomic layer deposition of a monolayer of a compound AB. Graph 120 shows a substrate 122 (such as the glass plate 102) having a surface 124 with discrete reactive sites (represented by notches 126). In cycle A, exposing the surface 124 to reactant A 128 results in self-limiting chemisorption of a monolayer 130 of material A. Graph 134 shows that a monolayer 130 of material A has been formed on top of the substrate 122. Graph 136 shows that the surface 132 of the monolayer 130 of material A becomes the starting surface for the deposition of material B. In cycle B, exposure to molecules of material B 134 results in the surface 132 being covered with a monolayer 136 of material B. Consequently, one AB cycle deposits one monolayer of compound AB and regenerates the initial surface.

The alternating reaction strategy eliminates the "line of sight" or "constant exposure" requirements that limit conventional thin film methods such as physical- or chemical-vapor deposition, and offers the capability to coat complex, three-dimensional objects with precise, conformal layers. This atom-by-atom growth approach allows atomic layer deposition to apply precise and conformal coatings over the surfaces of the microchannels 110. Each individual AB cycle can be performed in, for example, several seconds.

The following describes example reactions in which a layer of aluminum oxide (which can be used as the electron emissive layer 108 in FIG. 1A) is deposited in a binary reaction sequence (the surface species are designated by asterisks):

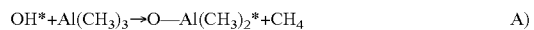

OH*+Al(CH$_3$)$_3$→O—Al(CH$_3$)$_2$*+CH$_4$   A)

O—Al—CH$_3$*+H$_2$O→O—Al—OH*+CH$_4$   B)

In reaction A, the glass substrate surface is initially covered with hydroxyl (OH) groups. The hydroxyl groups react with trimethyl aluminum vapor (Al(CH$_3$)$_3$, TMA) to deposit a monolayer of aluminum-methyl groups and give off methane (CH$_4$) as a byproduct. Because TMA is inert to the methyl-terminated surface, further exposure to TMA yields no additional growth beyond one monolayer. In reaction B, this new surface is exposed to water vapor regenerating the initial hydroxyl-terminated surface and again releasing methane. The net effect of one AB cycle is to deposit one monolayer of Al$_2$O$_3$ on the surface. Despite the atom-by-atom growth approach, thick films can be applied efficiently on planar surfaces since the individual AB cycles can be performed in several seconds. When coating porous materials, the AB cycle time is increased to allow the gaseous precursors to diffuse into the nano-pores.

A layer of gadolinium oxide (Gd$_2$O$_3$) (for example, for use as the layer of neutron sensitive material 104 in FIG. 1A) can be prepared using atomic layer deposition, with a variety of precursor combinations including gadolinium tris(2,2,6,6-tetramethyl-3,5-heptanedione) (Gd(thd)$_3$) and ozone, gadolinium tris(methylcyclopentadiene) (Gd(MeCp)$_3$) and water, and gadolinium tris(bis-trimethylsilylamide) (Gd[N(SiMe$_3$)$_2$]$_3$) and water. Although the Gd(MeCp)$_3$ precursor does not strictly yield self-limiting growth, this compound provides a relatively high atomic layer deposition growth rate of up to 0.3 nm/cycle with acceptable film thickness uniformity, and this can facilitate the deposition of the 1 μm neutron absorbing layer 104. Building up a layer 1 μm thick may require approximately 3,300 cycles. Evaluation of the coatings can be made by optical microscopy or scanning electron microscopy.

The resistive (semiconducting) layer 106 can be formed using atomic layer depositing techniques using a broad range of various materials. For example, alternating layers of two or more different materials can be deposited such that the resulting physical, chemical, and electronic properties of the compound material can be fine-tuned in between the separate component properties. Atomic layer deposition can be used to prepare thin film coatings with controlled resistance by blending together materials having both high and low resistance levels, such as Al$_2$O$_3$ and zinc oxide (ZnO) respectively. Al$_2$O$_3$ can be deposited using alternating exposures to TMA and H$_2$O, and ZnO can be deposited uses alternating exposures to diethyl zinc (DEZ) and H$_2$O. By controlling the relative number of TMA/H$_2$O and DEZ/H$_2$O cycles, AlZn$_x$O$_y$ alloy films can be deposited with precise control over both composition and thickness and the resistivity can be adjusted over a very wide range from 10$^{-3}$ to 10$^{16}$ Ω-cm. By depositing conformal layers of the AlZn$_x$O$_y$ alloy films on the surface of the glass plate 102, the resistance across the surface of the glass plate 102 can be controlled. For example, an $AlZn_xO_y$ alloy film with a thickness of 100 nm may yield a resistance across the glass plate of about $10^7\Omega$.

The layer of neutron sensitive material 104 can be formed using atomic layer depositing techniques. For example, to form a layer of $B_2O_3$, precursors $BBr_3$ and $H_2O$ can be used. To form a layer of BN (boron nitride), precursors $BBr_3$ and $NH_3$ can be used.

Figure 3:
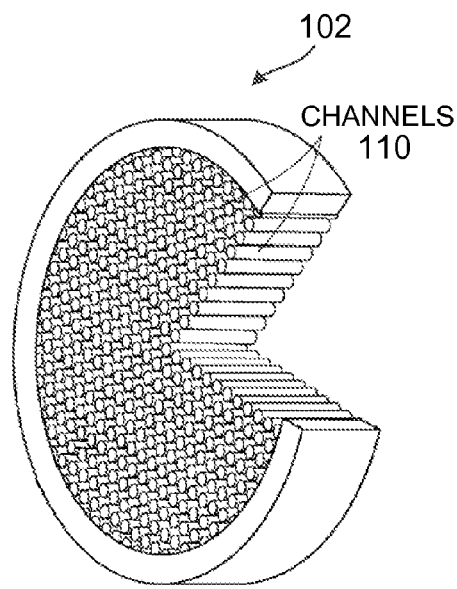
FIG. 3 is a diagram showing microchannels in a glass plate.

FIG. 3 is a diagram showing microchannels 110 in the glass plate 102.

FIG. 4 is a diagram showing the development of an avalanche of secondary electrons. Each channel 110 can serve as an independent electron multiplier. In operation, when an incident neutron 142 strikes the glass plate 102, the neutron 142 is captured by a boron-10 atom, and an alpha particle ($^4$He) and a lithium-7 ($^7$Li) particle are released. One or both of the lithium-7 and helium-4 particles pass out of the glass wall and enter one or more adjacent channels 110, freeing electrons along the way. Concurrently, the DC bias voltage is applied between the input and output electrodes 150, 152 such that the output electrode 152 has a more positive DC bias voltage than the input electrode 150. The DC bias voltage generates an electric field (for example, about 1 kV/mm) that attracts free electrons toward the output electrode 152. As free electrons strike the channel walls, more electrons (for example, secondary electrons 154) are released to form a cascade of electrons 156 that exit the output surface of the glass plate 102 and is detected as a signal at the output electrode 152. Thus, the glass plate 102 acts as an electron multiplier. In some implementations, the glass plate 102 can use commercially available glass material designed for use in microchannel plates, such as glass material available from Photonis, Sturbridge, Mass.

When the layers 104, 106, and 108 are formed on the glass plate 102, the layers 104, 106, 108 will not only be coated on the walls of the microchannels 110, they will also be coated on the input surface and output surface (web area) of the glass plate 102. Having the layers 104, 106, and 108 on the input and output surfaces of the glass plate 102 will likely have a small or negligible effect on the sensitivity of neutron detection. The effect, if any, can be compensated for by slightly increasing the microchannel plate bias voltage.

The following describes a neutron detector that uses the coincidence technique. This technique can be used when the microchannel plate 100 includes a neutron absorbing particle in which an interaction between a neutron and the neutron absorbing particle generates one or more gamma rays. The coincidence technique is described in U.S. Pat. No. 7,439,519, "Neutron Detection Based on Coincidence Signal," herein incorporated by reference.

Referring to FIG. 5, in some implementations, a neutron detector 170 includes a microchannel plate detector 172 and a gamma ray detector 174. The signal from the microchannel plate detector 172 is sent to a signal processor, such as a coincidence unit 188, for comparison with a signal from the gamma ray detector 174. The microchannel plate detector 172 includes a microchannel plate 100 having a glass plate 102 positioned between an input electrode 150 (connected to a more negative voltage) and an output electrode 152 (connected to a more positive voltage). An anode 160 is provided to collect electron emissions from the microchannel plate 100. The microchannel plate 100 and the anode 160 are housed within a vacuum chamber 176. The microchannel plate 100 is sensitive to neutrons (due to a layer of neutron sensitive material 104). The bulk material of the glass plate 102 may also absorb gamma rays and generate photoelectrons that enter the channel to generate spurious noise pulses. A readout signal from the anode 160 (or the output electrode 152) may indicate detection of a neutron or a gamma ray but typically does not provide information on whether a neutron or a gamma ray is detected.

In some implementations, the gamma ray detector 174 includes a fast scintillator crystal 178 and a photomultiplier tube (PMT) 180. The scintillator crystal 178 emits scintillation light upon receiving a gamma ray, and the PMT 180 captures the scintillation light. For example, the scintillator crystal 178 can be a LaBr3:Ce scintillator crystal, BrilLianCe®380 crystal, from Saint-Gobain Crystals, Newbury, Ohio. The PMT 180 can be model 83112-502, available from Burle Industries.

As described above, when a boron-10 atom captures a neutron to generate a lithium-7 ion, there is about 94% probability that the lithium-7 ion will initially be in an excited state, upon which the lithium-7 ion decays to a lower energy state and emits a 478 keV gamma ray. When a gadolinium atom (either $^{155}$Gd or $^{157}$Gd) captures a neutron, gamma rays are also emitted. If both the prompt gamma and the neutron pulse are observed within a short coincidence window (for example, about 10 ns), then the neutron event can be positively tagged with high confidence. All other counts outside this timing window are rejected, and considered as random gammas. The timing coincidence window of about 10 ns is short enough to statistically exclude most background gamma rays (even with gamma flux rates in the MHz region).

By measuring a time proximity of a signal from the microchannel plate 100 and a signal from the PMT 180, one can determine whether a neutron has been detected by the microchannel plate detector 172. The signal from the microchannel plate 100 indicates detection of a neutron or a gamma ray. The signal from the PMT 180 indicates detection of a gamma ray. Detecting a signal from the PMT 180 shortly (e.g., within 0.1 to 10 ns) after detecting a signal from the microchannel plate 100 indicates a high likelihood that a neutron absorption event accompanied by gamma ray emission has occurred.

An advantage of the neutron detector 170 is that by detecting coincidence between signals from the microchannel plate detector 172 and the gamma ray detector 174, false positive detection of neutrons can be reduced significantly.

The output signal of the microchannel plate detector 172 is sent to an amplifier 182 to amplify the signals received at the anode 160 (or the output electrode 152) of the microchannel plate detector 172, and the output of the amplifier 182 is sent to a timing module 184. The output of the PMT 180 is sent to a timing module 186. The timing modules 184 and 186 condition the signals from the microchannel plate detector 172 and PMT 180, taking into consideration the different signal paths traveled by the signals from the microchannel plate detector 172 and PMT 180 to the coincidence unit 188. The outputs of the timing modules 182 and 184 are sent to the coincidence unit 188, which determines whether the signal from the timing module 186 occurs within the timing coincidence window (e.g., 0.1 to 10 ns) of the signal from the timing module 184. The coincidence unit 188 can be, for example, model 2040, from Canberra, Meriden, Conn.

The coincidence unit 188 determines a time difference between a signal received from the timing module 184 and a later signal received from the timing module 186, and compares the time difference with the preset timing coincidence window. If the time difference is less than the timing coincidence window (for example, 10 ns), the coincidence unit 188 generates a pulse that is sent to a scaler/counter 190, indicating a neutron event. The counter 190 can be configured to count the number of neutron events per unit of time (for example, second). The counter 190 can be, for example, model 512, from Canberra. The output signal of the counter 190 can be sent to a computer 192 or data acquisition device for recording and analysis of the signal.

If there is no coincidence within 10 ns between the output signals of the microchannel plate detector 172 and the gamma ray detector 174, then either (i) a gamma ray of arbitrary energy is detected by the microchannel plate detector 172, and no 478 keV gamma ray is detected by the scintillator 178 within the 10 ns timing window, or (ii) a gamma ray is detected by the scintillator 178 but no corresponding neutron signal is detected by the microchannel plate detector 172.

The probability that a 478 keV gamma ray is detected within a 10 ns timing window, and another background gamma ray of any energy being detected by the microchannel plate detector 172 (which has 0.2% to 2% detection efficiency to gamma rays), is very small. Because there is about 94% probability that the boron-10 and neutron reaction will generate a lithium-7 ion in the excited state that decays with an emission of a 478 keV gamma ray, there is a probability of about 6% that neutron events would not result in an emission of a 478 keV gamma ray. Of the 478 keV gamma rays that are emitted isotropically, about 16% can be detected by the scintillator crystal 178 that is placed on the output side of the microchannel plate detector 172. Using two larger scintillator crystals, one positioned at the input side and the other positioned at the output side of the microchannel plate detector 172, can significantly increase the detection rate of the gamma rays, due to larger solid angle capture.

The neutron detector 170 can have a spatial resolution of about 10 μm, and with good detection capabilities for both cold and thermal neutrons. The neutron detector 170 can have a wide variety of applications in neutron radiography and scattering, including biological/medical imaging, inspection of electronic components, construction materials, soils, foods, art objects, studies of hydrogen and water content, analysis of moisture transport and diffusion, and analysis of the accumulation of hydrogen in irradiated samples as fuel element cladding and spallation target studies. The neutron detector 170 can be used in hand-held imaging and counting for monitoring and imaging of nuclear reactor leaks, larger arrayed 2-D position-sensitive detection systems for neutron scattering halls, neutron powder diffraction, and potentially real-time neutron imaging.

For example, the neutron detector 170 can provide a better insight of fuel cell development by monitoring the presence of water in the fuel cell membrane and preventing its unwanted occurrence. This can lead to the enhancement for fuel cell products. The neutron detector 170 can be used in the study of structural biology and biological physics, such as obtaining information about the structure and dynamics of biological systems. Neutron imaging techniques have an advantage in probing deeply into the sample volume or bulk. As an example, changes in neutron energy and momentum, when scattered at small angles from proteins, macromolecular crystal lattices, or membranes, can yield fine structural details. The respective deBroglie wavelengths of cold and thermal neutron beams, of greater than 4 Å and 2 Å, with negligible absorption in biological materials, correspond to atomic spacing and fluctuation amplitudes as well as energies that are well-suited to typical excitation energies in biological samples. The neutron detector 170 can be used in airport portal screening, monitoring of special nuclear materials (SNM), first responders, and critical operations.

The following describes a neutron detector that uses the induced pulse technique. The induced pulse technique is described in U.S. patent application Ser. No. 13/016,876, "Neutron Detection Based on Induced Charges," filed on Jan. 28, 2011, herein incorporated by reference.

In some implementations, neutrons and gamma rays can be distinguished based on characteristics of charges induced on input and output electrodes of the microchannel plate 100. When an incident neutron or a gamma ray interacts with the glass plate 102, the interaction produces moving charged particles that induce electric charges in the input and output electrodes 150, 152. Due to different energy levels of the particles generated from the interactions, the electric charges induced on the input and output electrodes 150, 152 for an incident neutron are different from those for an incident gamma ray. By using information about the charges induced on both the input and output electrodes 150, 152, one can detect neutrons with high confidence.

Figure 6:
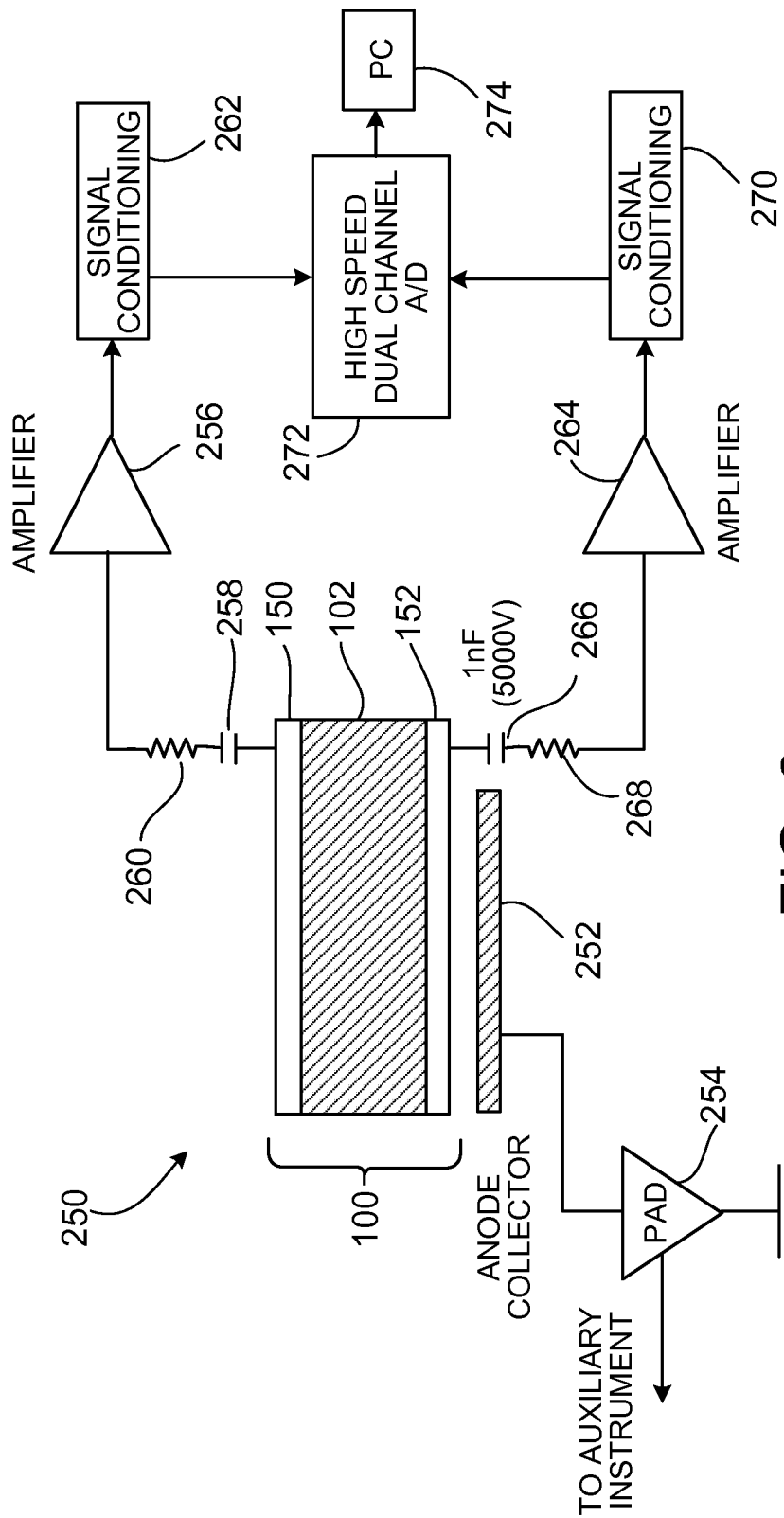

Referring to FIG. 6, a neutron detector 250 includes a microchannel plate 100 have an input electrode 150, an output electrode 152, and a glass plate 102 positioned between the input and output electrodes 150, 152. The microchannel plate 100 has an array of microscopic channels 110 each having a diameter of about, for example, 5 to 10 microns (μm). The surface of the microchannels 110 may have a thin layer of neutron-absorbing material 104, a thin layer of semiconducting material 106, and a thin layer of electron emissive material 108 formed using, for example, atomic layer deposition. The neutron-absorbing material can be, for example, compounds that contain boron-10 or lithium-6. The input and output electrodes 150, 152 can be, for example, metal layers that are coated onto the top and bottom surfaces of the glass plate 102. The input and output electrodes 150, 152 have openings that correspond to the channel openings.

In some implementations, the input electrode 150 may be connected to a voltage source to have a voltage level of −2000 to −1000 volts, and the output electrode 152 may be connected to a voltage source to have a voltage level of −100 volts. The DC voltage difference between the input and output electrodes 150, 152 generates an electric field (e.g., about 1 kV/mm) that attracts the free electrons toward the output electrode 152. As the electrons strike against the channel walls, more electrons are released, triggering an avalanche of secondary electrons in the microchannels 110. The electrons pass through the openings in the output electrode 152 and are collected by an anode collector 252, which is connected to the electric ground voltage through a pad 254. The pad 254 may be connected to auxiliary instruments, such as an oscilloscope.

The glass in the microchannel plate 102 may include lead (Pb), which is sensitive to gamma rays. When an incident gamma ray interacts with a lead atom, an energetic electron is released, which passes out of the glass and enter an adjacent channel, in most cases freeing a few electrons (e.g., less than 10) along the way. The one or a few electrons are attracted toward the output electrode 152, and as the electrons strike against the channel walls, more electrons are released, triggering an avalanche of secondary electrons in the microchannels 110. The electrons pass through the openings in the output electrode 152 and are collected by the anode 252.

The avalanche of secondary electrons in the microchannels 110 can induce charges on the input electrode 150 and the output electrode 152. The charges induced on the input electrode 150 can be amplified by an amplifier 256. A capacitor 258 between the input electrode 150 and the amplifier 256 blocks DC signals while allowing AC signals to pass, decoupling the amplifier 256 from the input electrode 150. A resistor 260 is provided to prevent voltage spikes from damaging the amplifier 256. The output signals from the amplifier 256 can be conditioned by a signal conditioning unit 262. The charges induced on the output electrode 152 can be amplified by an amplifier 264. A capacitor 266 between the output electrode 152 and the amplifier 264 blocks DC signals while allowing AC signals to pass, decoupling the amplifier 264 from the output electrode 152. A resistor 268 is provided to prevent voltage spikes from damaging the amplifier 264. The output signals from the amplifier 264 can be conditioned by a signal conditioning unit 270. For example, the signal conditioning units 262, 270 may introduce delays in one or both of the output signals from the amplifiers 256, 264 to compensate for differences in the signal paths traveled by the signals. After amplification and conditioning, the signals from the input and output electrodes 150, 152 are sent to a high-speed dual channel analog-to-digital converter 272 that samples the analog signals and converts them to digital data. The digital data are stored and processed by a computer 274 (or any other data processing apparatus).

More electrons are generated from the interaction between a neutron and the boron-10 or lithium-6 atom than from the interaction between a gamma ray and a lead atom. As a result, charges $Q_{in}^\alpha$ and $Q_{out}^\alpha$ induced on the input and output electrodes 150, 152, respectively, associated with a neutron event are greater than the charges $Q_{in}^\gamma$ and $Q_{out}^\gamma$, induced on the input and output electrodes 150, 152, respectively, associated with a gamma ray event.

Judging by the amplitude of the induced charges in the input and output electrodes 150, 152 may not be sufficient to accurately determine whether a neutron or a gamma ray has been detected because the total number of secondary electrons depends on the location of the interaction between the neutron and the boron-10 or lithium-6 atom, or between the gamma ray and the lead atom. The difference in the induced charges resulting from a neutron interacting with a boron-10 or lithium-6 atom located near the output electrode 152 and the induced charges resulting from a gamma ray interacting with a lead atom located near the input electrode 150 may not be sufficiently large to allow accurate determination of whether a neutron or gamma ray is detected.

In some implementations, a neutron verification parameter W1 used for discriminating between neutrons and gamma rays can be calculated using the following formula:

$$W1 = \frac{Q_{in}/Q_{out}}{Q_{in} + Q_{out}}, \quad \text{(Equation 1)}$$

where Qin represents the charges induced on the input electrode 150 and Qout represents the charges induced on the output electrode 152.

In Equation 1, the charges are normalized to compensate for the variances in the induced charges due to the variations in the locations where the interactions occur. The denominator (Qin+Qout) will be substantially larger for a neutron event than a gamma ray event, so the neutron verification parameter W1 will have a substantially smaller value for a neutron event than for a gamma ray event.

The neutron detector 250 can be calibrated by irradiating the microchannel plate 100 with neutrons generated from a neutron source and calculating the values for the neutron verification parameter W1. The neutron verification parameters W1 may have values that fall within a first range of values. The first range of values are stored in the computer 274 and are associated with neutron events.

The microchannel plate 100 is then irradiated with gamma rays generated from a gamma ray source, and values for the neutron verification parameter W1 are calculated. The neutron verification parameters W1 may have values that fall within a second range of values. The second range of values are stored in the computer 274 and are associated with gamma ray events.

When the neutron detector 250 is used to detect radiation from an unknown source, the charges Qin and Qout induced on the input and output electrodes 150, 152, respectively, are measured and the neutron verification parameter W1 is calculated. If the neutron verification parameter W1 is within the first range of values associated with a neutron event, the neutron detector 250 generates a signal indicating that a neutron has been detected. If the neutron verification parameter W1 is within the second range of values associated with a gamma ray event, the neutron detector 250 determines that a gamma ray has been detected.

In some implementations, charges induced on the input and output electrodes 150, 152 due to movements of the charges prior to the development of avalanche of secondary electrons can also be used to discriminate between a neutron event and a gamma ray event.

Figure 7:
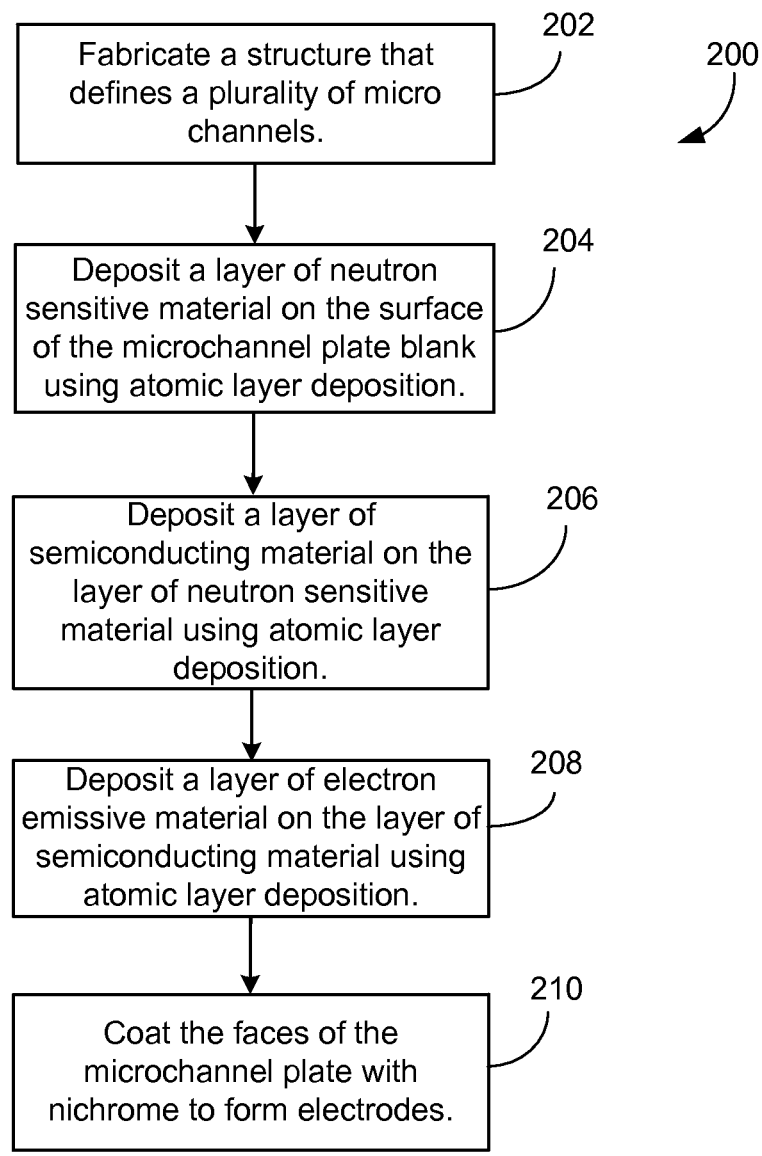
FIGS. 7 to 9 are flow diagrams of processes.

FIG. 7 is a diagram of a process 200 for fabricating a microchannel plate.

In process 200, a structure that defines a plurality of microchannels is fabricated 202. For example, the structure can be the glass plate 102 of FIG. 1A. The structure can be formed by using, for example, fibers each including a soluble core and a layer of cladding surrounding the soluble core, and removing the soluble core to form microchannels. The fibers can be formed as follows. Low-Z bulk glass that includes zero or a low percentage of lead (e.g., having less than 5 mol %) and zero or a low percentage of neutron sensitive material (e.g., having less than 1 mol %) is melted and cast into right cylinders and reworked into a bulk glass tube by high-temperature extrusion through a set of dies. Soluble core glass is made into a rod having a diameter of, for example, one inch. The inner diameter of the bulk glass tube is slightly larger than the diameter of the core glass rod. The core glass rod is inserted into the bulk glass tube. A combination of the rod and the glass tube is heated and drawn into a pencil sized rod (e.g., the combination is pulled to become longer and have a smaller diameter). A series of drawn rods are bundled, heated, and drawn into a fiber such that the initial 1-inch diameter core rod is reduced to 5 µm in diameter.

The drawn fibers are assembled in a hexagonal preform and fused together forming a solid glass billet. The billet is sliced into thin wafers at a 0.5-1° bias (for accurate neutron event localization and minimal parallax blurring). The faces of the thin wafer are polished, and the edges of the wafer are ground into a round shape to produce a solid microchannel plate blank. The solid microchannel plate blank is immersed into a dilute acid to etch away the core glass, leaving millions of small holes in the range of about 5 to 10 µm in diameter. For example, a microchannel plate blank having a diameter of 1 inch may have about 3 to 5 million microchannels. The microchannels can have a length that is at least 10 times the diameter of the microchannels. The bulk glass tube and the core glass rod can have circular, square, rectangular, or hexagonal cross sections, resulting in microchannels that have circular, square, rectangular, or hexagonal cross sections.

Step 2: A layer of neutron sensitive material is deposited 204 on the surface of the microchannel plate blank using atomic layer deposition. For example, the layer of neutron sensitive material can be the layer 104 of FIG. 1A. The layer of neutron sensitive material can include boron-10, lithium-6 or gadolinium, or a compound that includes boron-10, lithium-6 or gadolinium. The compound can include boron-10 oxide, boron-10 nitride, lithium-6 oxide, or gadolinium oxide. The layer of neutron sensitive material can have a thickness in a range from 0.5 to 5 microns.

Step 3: A layer of semiconducting material is deposited 206 on the layer of neutron sensitive material using atomic layer deposition. For example, the layer of semiconducting material can be the layer 106 of FIG. 1A. The layer of semiconducting material can have a thickness in a range from 50 to 1000 nm. The semiconducting material can include, for example, a $AlZn_xO_y$ alloy film.

Step 4: A layer of electron emissive material is deposited 208 on the layer of semiconducting material using atomic layer deposition. For example, the layer of electron emissive material can be the layer 108 of FIG. 1A. The layer of electron emissive material can have a thickness in a range from 3 to 12 nm. The electron emissive material can include aluminum oxide ($Al_2O_3$) or magnesium oxide (MgO).

Step 5: The faces of the microchannel plate are coated 210 with nichrome to serve as the electrodes for application of a voltage to generate electric fields in the microchannels. This completes the processing of the microchannel plate, which is ready for testing and packaging.

Figure 8:
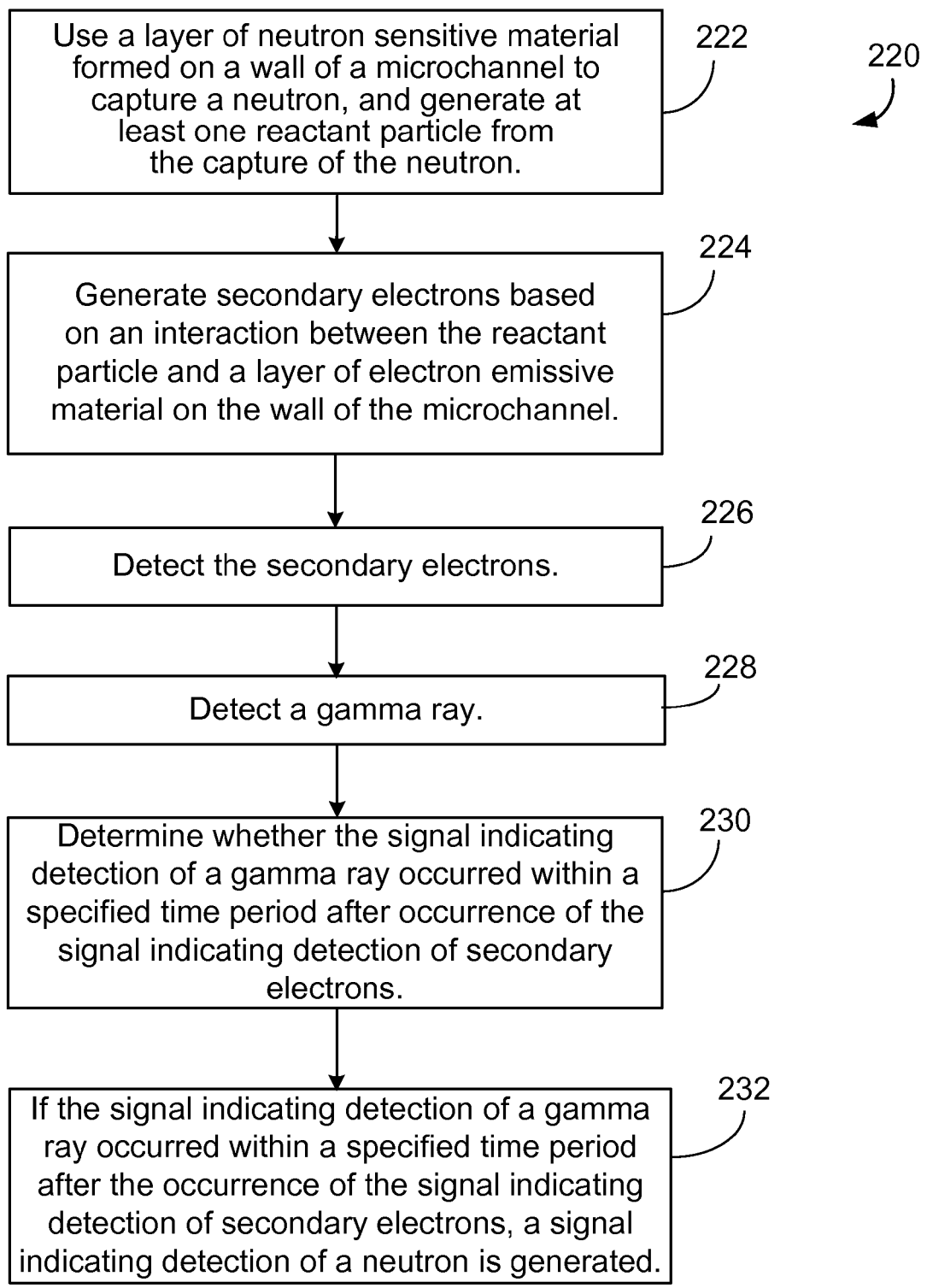

FIG. 8 is a diagram of a process 220 for using a microchannel plate to detect neutrons based on the coincidence technique.

Step 1: A layer of neutron sensitive material formed on a wall of a microchannel of a microchannel plate is used to capture 222 a neutron and generate at least one reactant particle from the capture of the neutron. The microchannel plate can include a glass plate having a structure that defines the microchannel, and the glass plate can include glass having less than 5 mol % lead (Pb) and less than 1 mol % of the neutron sensitive material.

For example, the microchannel plate can be the microchannel plate 100 of FIG. 1A. The layer of neutron sensitive material can be the layer 104. The layer of neutron sensitive material can include boron-10 or gadolinium, or a compound that includes boron-10 or gadolinium. The compound can include boron-10 oxide, boron-10 nitride, or gadolinium oxide. The layer of neutron sensitive material can have a thickness in a range from 0.5 to 5 microns.

Step 2: Secondary electrons are generated 224 based on an interaction between the reactant particle and a layer of electron emissive material on the wall of the microchannel. For example, the layer of electron emissive material can be the layer 108 of FIG. 1A. The layer of electron emissive material can have a thickness in a range from 3 to 12 microns. The electron emissive material can include aluminum oxide ($Al_2O_3$) or magnesium oxide (MgO).

Step 3: The secondary electrons are detected 226. For example, a signal pulse from the anode 160 (or the output electrode 152) can indicate detection of secondary electrons.

Step 4: A gamma ray is detected 228. For example, the gamma ray detector 174 can be used to detect a gamma ray and generate a signal indicating that a gamma ray has been detected.

Step 5: Determine 230 whether the signal indicating detection of a gamma ray occurred within a specified time period after occurrence of the signal indicating detection of secondary electrons.

Step 6: If the signal indicating detection of a gamma ray occurred within the specified time period after the occurrence of the signal indicating detection of secondary electrons, a signal indicating detection of a neutron is generated 232.

Figure 9:
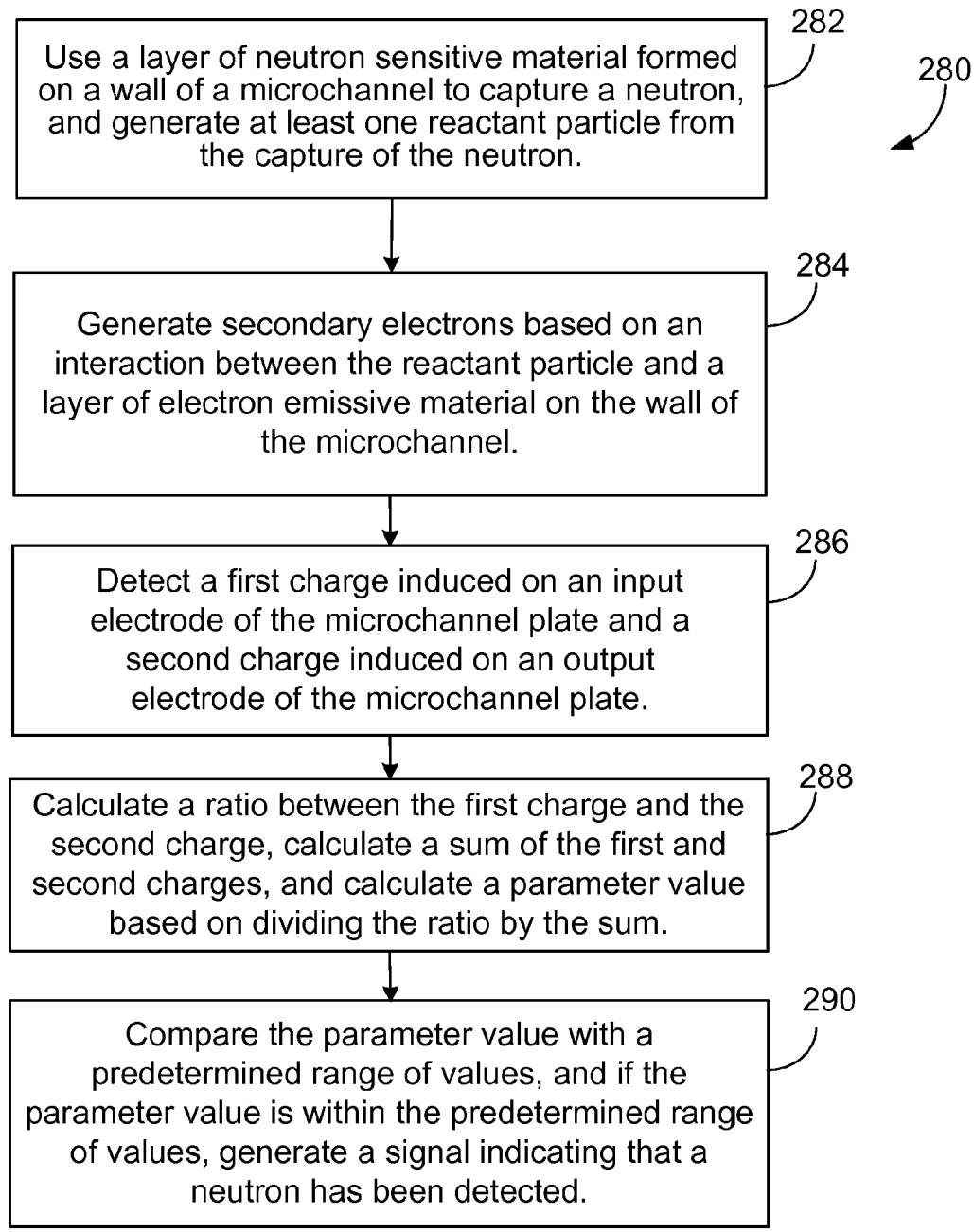

FIG. 9 is a diagram of a process 280 for using a microchannel plate to detect neutrons based on the induced pulse technique.

Step 1: A layer of neutron sensitive material formed on a wall of a microchannel of a microchannel plate is used to capture 282 a neutron and generate at least one reactant particle from the capture of the neutron. The microchannel plate can include a glass plate having a structure that defines the microchannel, and the glass plate can include glass having less than 5 mol % lead (Pb) and less than 1 mol % of the neutron sensitive material.

For example, the microchannel plate can be the microchannel plate 100 of FIG. 1A. The layer of neutron sensitive material can be the layer 104. The layer of neutron sensitive material can include boron-10 or lithium-6, or a compound that includes boron-10 or lithium-6. The compound can include boron-10 oxide, boron-10 nitride, or lithium-6 oxide. The layer of neutron sensitive material can have a thickness in a range from 0.5 to 5 microns.

Step 2: Secondary electrons are generated 284 based on an interaction between the reactant particle and a layer of electron emissive material on the wall of the microchannel. For example, the layer of electron emissive material can be the layer 108 of FIG. 1A. The layer of electron emissive material can have a thickness in a range from 3 to 12 microns. The electron emissive material can include aluminum oxide ($Al_2O_3$) or magnesium oxide (MgO).

Step 3: A first charge induced on an input electrode of the microchannel plate and a second charge induced on an output electrode of the microchannel plate are detected (286). For example, a first charge induced on the input electrode 150 of the microchannel plate 100 and a second charge induced on the output electrode 152 of the microchannel plate 100 can be detected.

Step 4: A ratio between the first charge and the second charge, and a sum of the first and second charges, are calculated (288). A parameter value is calculated based on dividing the ratio by the sum.

Step 5: The parameter value is compared with a predetermined range of values, and if the parameter value is within the predetermined range of values, a signal is generated (290) indicating that a neutron has been detected.

It is to be understood that the foregoing description is intended to illustrate and not to limit the scope of the neutron detection devices described herein. For example, the microchannel plate detector 172 can include several microchannel plates 100 stacked together. The dimensions of the microchannels 110 and other parameters can be different from those described above. Boron-10, lithium-6 and gadolinium may exist in other forms. The resistive layer 106 can include materials other than those described above. For example, the resistive layer 106 can include a mixture of one or more conductive and one or more insulating materials so that the resistive layer 106 can have semiconducting properties. The conductive materials may include ZnO, $SnO_2$, $In_2O_3$, and the insulating materials may include $Al_2O_3$ and $TiO_2$.

In some examples, the low-Z bulk glass that is used to form the fibers for fabricating the glass plate 102 can have zero or a low percentage of neutron sensitive material (e.g., having less than 0.1 mol %). In some examples, the low-Z bulk glass can include neutron sensitive material (e.g., having more than 0.1 mol %, or more than 10 mol % boron). In the latter case, the coating of neutron sensitive material in the surface of the microchannel enhances the sensitivity of the neutron detector 100 to neutrons.

In some implementations, a microsphere plate can be used instead of a microchannel plate. For example, the neutron detector 170 (FIG. 5) or neutron detector 250 (FIG. 6) can include a microsphere plate detector instead of the microchannel plate detector 172. A microsphere plate can include a glass plate formed of microscopic glass spheres. The glass spheres can have a diameter equal to or less than, for example, 100 microns. The microscopic glass spheres can be coated with a layer of neutron sensitive material (similar to layer 104), a layer of semi-conductive material (similar to layer 106), and a layer of electron emissive material (similar to layer 108). The neutron sensitive material, semi-conductive material, and electron emissive material can be formed on the surfaces of the microspheres using, for example, atomic layer deposition. The spheres are packed and bonded together, e.g., by compression and sintering. Electrodes are attached to the top and bottom faces of the microsphere plate to allow high bias voltages to be applied to the microsphere plate. As incident particles collide against the surfaces of the spheres to form secondary electrons, a cascade of electrons can be formed as the secondary electrons accelerate through the interstices defined by the spheres and collide against the surfaces of other spheres. The microspheres can include bodies having other shapes, such as oval-shaped bodies or irregularly-shaped bodies.

In some implementations, a microfiber plate can be used instead of a microchannel plate. For example, the neutron detector 170 (FIG. 5) or neutron detector 250 (FIG. 6) can include a microfiber plate detector instead of the microchannel plate detector 172. A microfiber plate can include multiple layers of microfibers that are laminated together. The microfibers can have a diameter equal to or less than, for example, 100 microns. Prior to lamination, the microfibers can be coated with a layer of neutron sensitive material (similar to layer 104), a layer of semi-conductive material (similar to layer 106), and a layer of electron emissive material (similar to layer 108). The neutron sensitive material, semi-conductive material, and electron emissive material can be formed on the surfaces of the microfibers using, for example, atomic layer deposition. In some examples, sheets of microfibers are stacked together, and the stack of microfibers are fused at a high temperature in an oven, such that the contact points of the individual microfibers are slightly fused together. A layer of nichrome is coated on each of the top and bottom faces of the microfiber plate. The nichrome layers serve as electrodes that allow high bias voltages to be applied to the microfiber plate. As incident particles collide against the surfaces of the microfibers to form secondary electrons, a cascade of electrons can be formed as the secondary electrons accelerate through the interstices defined by the microfibers and collide against the surfaces of other microfibers. The cross sections of the microfibers can have various shapes, such as circular, oval, square, or irregular shaped cross sections.

Elements of different embodiments described above may be combined to form embodiments not specifically described herein. Other implementations not specifically described herein are also within the scope of the following claims.

What is claimed is:

1. An apparatus comprising:
   a microfiber plate comprising:
      a plurality of microfibers that define interstices between the microfibers;
      layers of materials disposed on surfaces of the microfibers, the layers including a layer of neutron sensitive material, a layer of semiconducting material, and a layer of electron emissive material, in which the layer of semiconducting material does not include neutron sensitive material;
      an input electrode; and
      an output electrode, in which the microfibers are disposed between the input and output electrodes.

2. The apparatus of claim 1 in which the layer of neutron sensitive material comprises at least 50 mol % of neutron sensitive material.

3. The apparatus of claim 1 in which the layer of neutron sensitive material comprises at least one of boron-10, lithium-6, or gadolinium.

4. The apparatus of claim 1 in which the layer of neutron sensitive material comprises a compound that comprises at least one of boron-10, lithium-6, or gadolinium, and the compound comprises at least one of boron-10 oxide, boron-10 nitride, lithium-6 oxide, or gadolinium oxide.

5. The apparatus of claim 1 in which the layer of neutron sensitive material has a thickness in a range from 0.5 to 5 microns.

6. The apparatus of claim 1 in which the layer of semiconducting material has a thickness in a range from 50 to 1000 nm.

7. The apparatus of claim 1 in which the semiconducting material comprises $AlZn_xO_y$ alloy, x and y being positive integers.

8. The apparatus of claim 1, comprising a data processor to determine whether a neutron has been detected based on information derived from a charge induced on the output electrode.

9. A method of fabricating a microfiber plate, the method comprising:
   providing a plurality of microfibers that define interstices between the microfibers; and
   depositing layers of materials on surfaces of the microfibers, including
      depositing a layer of neutron sensitive material,
      depositing a layer of semiconducting material, and
      depositing a layer of electron emissive material.

10. The method of claim 9 in which depositing a layer of neutron sensitive material comprises using atomic layer deposition to deposit a layer of neutron sensitive material.

11. The method of claim 10 in which using atomic layer deposition to deposit a layer of neutron sensitive material comprises using atomic layer deposition to deposit a layer of a material comprising at least one of boron-10, gadolinium, or lithium-6.

12. The method of claim 10 in which using atomic layer deposition to deposit a layer of neutron sensitive material comprises using atomic layer deposition to deposit a layer of compound material comprising at least one of boron-10, gadolinium, or lithium-6, and the compound material comprises at least one of boron-10 oxide, boron-10 nitride, lithium-6 oxide, or gadolinium oxide.

13. The method of claim 10 in which using atomic layer deposition to deposit a layer of neutron sensitive material comprises using atomic layer deposition to deposit at least two of boron-10, lithium-6, or gadolinium.

14. The method of claim 9 in which depositing a layer of semiconducting material comprises using atomic layer deposition to deposit a layer of semiconducting material.

15. The method of claim 9 in which depositing a layer of electron emissive material comprises using atomic layer deposition to deposit a layer of electron emissive material.

16. The method of claim 9 in which depositing a layer of neutron sensitive material, a layer of semiconducting material, and a layer of electron emissive material on the microfibers comprises depositing a layer of neutron sensitive material, followed by depositing a layer of semiconducting material, and followed by depositing a layer of electron emissive material on the microfibers.

17. A method of detecting neutrons, the method comprising:

using a layer of neutron sensitive material formed on surfaces of microfibers of a microfiber plate to capture a neutron and generate at least one reactant particle;

detecting secondary electrons that are generated based on an interaction between the reactant particle and a layer of electron emissive material on the surfaces of the microfibers;

flowing a bias current through a layer of a semiconducting material formed on a surface of each of at least some of the microfibers to neutralize positive surface charges due to emission of secondary electrons, the layer of the semiconducting material not containing the neutron sensitive material; and generating a first signal indicating detection of a neutron.

18. The method of claim 17, further comprising generating a second signal indicating detection of the secondary electrons, generating a third signal indicating detection of a gamma ray, determining whether the third signal occurred within a specified time period after occurrence of the second signal, and generating the first signal only if the third signal occurred within the specified time period after occurrence of the second signal.

19. The method of claim 17, comprising determining whether a neutron has been detected based on information derived from a charge induced on an output electrode of the microfiber plate.

20. The method of claim 17, comprising determining whether a neutron has been detected based on first information derived from a first charge induced on an input electrode of the microfiber plate and second information derived from a second charge induced on the output electrode of the microfiber plate.

* * * * *